(12) United States Patent
Chuang et al.

(10) Patent No.: US 8,895,349 B2
(45) Date of Patent: *Nov. 25, 2014

(54) BACKSIDE ILLUMINATED IMAGE SENSOR HAVING CAPACITOR ON PIXEL REGION

(71) Applicant: Taiwan Semiconductor Manufacturing Company, Ltd., Hsinchu (TW)

(72) Inventors: Chun-Chieh Chuang, Tainan (TW); Dun-Nian Yaung, Taipei (TW); Jen-Cheng Liu, Hsinchu (TW); Jeng-Shyan Lin, Tainan (TW); Wen-De Wang, Minsyong Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/045,298

(22) Filed: Oct. 3, 2013

(65) Prior Publication Data

US 2014/0030842 A1 Jan. 30, 2014

Related U.S. Application Data

(63) Continuation of application No. 12/820,656, filed on Jun. 22, 2010, now Pat. No. 8,569,807.

(60) Provisional application No. 61/238,757, filed on Sep. 1, 2009.

(51) Int. Cl.
| | |
|---|---|
| *H01L 21/00* | (2006.01) |
| *H01L 27/148* | (2006.01) |
| *H01L 27/146* | (2006.01) |
| *H01L 49/02* | (2006.01) |

(52) U.S. Cl.
CPC ............ *H01L 27/1461* (2013.01); *H01L 28/40* (2013.01); *H01L 27/14643* (2013.01); *H01L 27/14609* (2013.01)
USPC 438/78; 257/228; 257/E31.078; 257/E31.081

(58) Field of Classification Search
None
See application file for complete search history.

(56) References Cited

U.S. PATENT DOCUMENTS

| 8,569,807 B2 * | 10/2013 | Chuang et al. ............... 257/228 |
| 2006/0086956 A1 | 4/2006 | Furukawa et al. |
| 2006/0154433 A1 * | 7/2006 | Onoda ......................... 438/393 |

(Continued)

FOREIGN PATENT DOCUMENTS

| CN | 1801475 | 7/2006 |
| CN | 1812111 | 8/2006 |
| CN | 101106134 | 1/2008 |
| CN | 101399276 | 4/2009 |

OTHER PUBLICATIONS

Office Action dated Jan. 7, 2013 from corresponding application No. CN 201010272246.6.

(Continued)

*Primary Examiner* — William F Kraig
*Assistant Examiner* — Khaja Ahmad
(74) *Attorney, Agent, or Firm* — Lowe Hauptman & Ham, LLP

(57) ABSTRACT

An approach is provided for forming a backside illuminated image sensor that includes a semiconductor substrate having a front side and backside, a sensor element formed overlying the frontside of the semiconductor substrate, and a capacitor formed overlying the sensor element.

20 Claims, 2 Drawing Sheets

(56) References Cited

U.S. PATENT DOCUMENTS

2006/0164531 A1* 7/2006 Yaung et al. .................. 348/308
2007/0020893 A1* 1/2007 Ueno et al. .................... 438/479
2007/0262364 A1  11/2007 Hsu et al.
2008/0006868 A1  1/2008 Hsu et al.
2009/0078973 A1* 3/2009 Hsu et al. ...................... 257/292
2009/0201400 A1  8/2009 Zhang et al.

OTHER PUBLICATIONS

Office Action from corresponding application No. CN 201010272246.6.

* cited by examiner

BACKSIDE ILLUMINATED IMAGE SENSOR HAVING CAPACITOR ON PIXEL REGION

PRIORITY CLAIM

The present application is a continuation of U.S. application Ser. No. 12/820,656, filed Jun. 22, 2010, which claims priority of U.S. Provisional Application No. 61/238,757, filed on Sep. 1, 2009, which are incorporated herein by reference in their entireties.

TECHNICAL FIELD

The disclosure relates to image sensors, and more particularly, to backside illuminated image sensors and manufacturing methods of forming thereof.

BACKGROUND

Complementary metal-oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras. Generally, CMOS image sensors utilize light-sensitive CMOS circuitry to convert light energy into electrical energy. The light-sensitive CMOS circuitry typically includes a photo-diode formed in a silicon substrate. As the photo-diode is exposed to light, an electrical charge is induced in the photo-diode. The photo-diode is typically coupled to a MOS switching transistor, which is used to sample the charge of the photo-diode. Colors may be determined by placing filters over the light-sensitive CMOS circuitry.

Typically, CMOS image sensors are fabricated utilizing a capacitance within the photo-diode and a floating capacitance created between transistor connections. These capacitances, however, are characterized by small capacitance values, which cause a high susceptibility to noise and reduce the maximum output signal. Attempts have been made to increase the signal generated by a photo-diode, but these increase the electrical charge generated by the photo-diode and do not necessarily increase the output signal. Furthermore, CMOS image sensors are typically fabricated utilizing MOS transistors having a polysilicon gate and silicon nitride spacers. This type of transistor, however, introduces a silicon surface trap and leakage. As a result, noise on the output signal increases and the dark signal increases.

The CMOS image sensors typically need one or more capacitors per pixel array. In the conventional frontside illuminated (FSI) image sensor application, the photodiode region, the transistor region, and the capacitor region are implemented on one wafer during the same fabrication process, and the distance from a lens to the photodiode becomes large due to a back-end-of-the-line (BEOL) metal line formed on the transistor region and the capacitor region, thus there is a great loss of the light signal entered into the photodiode region. The transistor region and the capacitor region coexist in one image sensor device, which results in a region where all of the light incident cannot be absorbed but, rather, is lost.

BRIEF DESCRIPTION OF THE DRAWINGS

The aforementioned objects, features of this disclosure will become apparent by referring to the following detailed description of the exemplary embodiments with reference to the accompanying drawings, wherein.

DETAILED DESCRIPTION OF ILLUSTRATIVE EMBODIMENTS

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Exemplary embodiments illustrate Backside illuminated (BSI) image sensors that are used for sensing a volume of exposed light projected towards the backside surface of a substrate. The pixels are located on the frontside of the substrate, and the substrate is thin enough so that light projected towards the backside of the substrate can reach the pixels. Backside illuminated image sensors provide a high fill factor and reduced destructive interference, as compared to frontside illuminated sensors. The following will provide embodiments of backside illuminated image sensors including capacitors. The capacitors may be selected from metal-insulator-metal (MIM) capacitors, metal-oxide-metal (MOM) capacitors, or combinations thereof.

Figure 1:
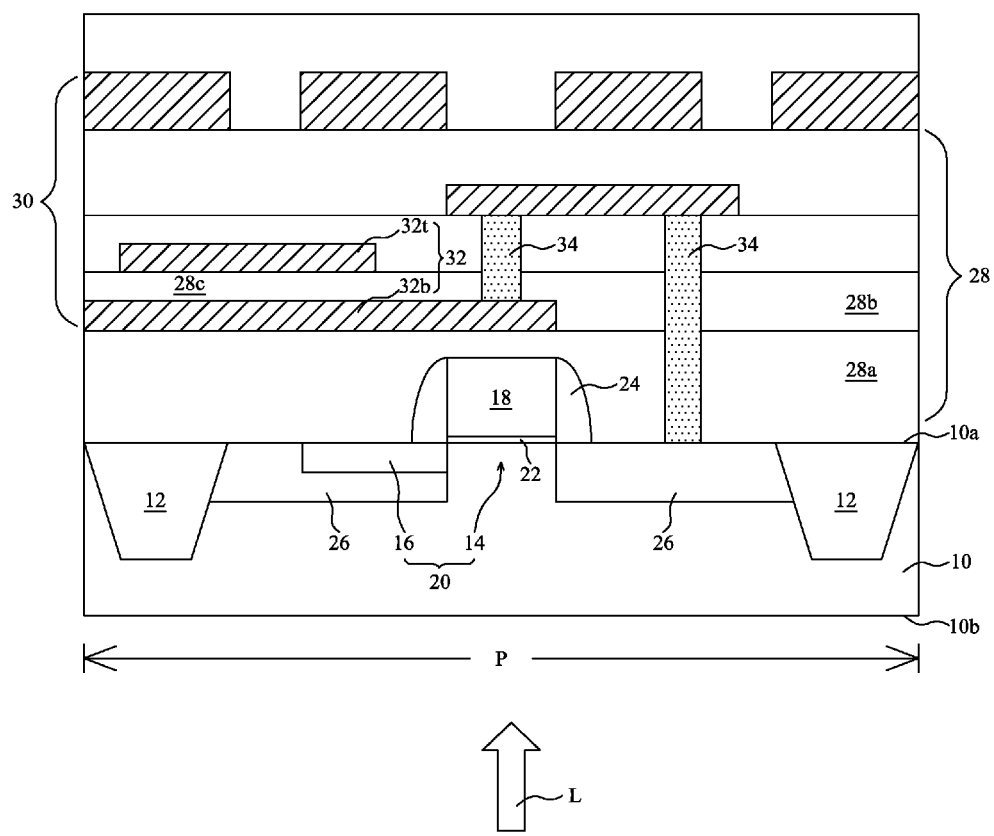
FIG. 1 is a cross-sectional diagram depicting an exemplary embodiment of a backside illuminate image sensor with a MIM capacitor.

Herein, cross-sectional diagram of FIG. 1 depicts an exemplary embodiment of a backside illuminated image (BSI) sensor including a capacitor in a pixel region. A semiconductor substrate 10 having a frontside 10a and a backside 10b is provided. The frontside 10a is an active surface on which circuit design is formed, and light L will be projected towards the backside 10b to reach pixel regions P. The semiconductor substrate 10 has a first conductivity type. In an embodiment, the semiconductor substrate 10 comprises a p-type silicon substrate. The semiconductor substrate 10 may be doped at an appropriate level to form a device, however, an impurity well (not shown) may also be formed if necessary. In an embodiment, the semiconductor substrate 10 includes a relatively low-concentration P-type epitaxial silicon layer grown on a relatively high-concentration P-type substrate. Circuit design is formed on the front surface 10a (active surface) of the semiconductor substrate 10. The circuit design includes sensor elements, metal interconnects, metal contacts, metal pads, and other circuitry, and the metal interconnects are formed inside a dielectric layer and/or a passivation layer. It is understood that conventional processes and equipment are used to fabricate the sensor elements, metal interconnects, metal contacts, metal pads, and other circuitry.

An isolation structure 12 is formed in a predetermined portion of a semiconductor substrate 10 to separate different devices formed in and/or on the semiconductor substrate 10, thereby defining active regions. In an embodiment, the isolation structure 12 is formed in a P-type epitaxial silicon layer grown on a P-type substrate. In one embodiment, the isolation structure 12 is a Shallow Trench Isolation (STI) structure that is typically a trench extending into a predetermined depth of the semiconductor substrate 10 and filled with oxide or any other dielectric materials. A channel stop region (not shown) may be formed on a sidewall and/or a bottom surface of the isolation structure 12. The channel stop region may be formed as an impurity region of equal type relative to the semiconductor substrate 10, and may act to remove a dark source of charge.

One or more sensor elements 20 are formed on the active surface of the semiconductor substrate 10. In an embodiment, the sensor element 20 is disposed in the pixel region P over the frontside 10a and extended into the semiconductor substrate 10. The sensor elements 20 each may comprise a light-sensing region (or a photo-sensing region) which may be a doped region having n-type and/or p-type dopants formed in the semiconductor substrate 10 by a method such as diffusion or ion implantation. The sensor element 20 may include photodiodes, pinned layer photodiodes, non-pinned layer photodiodes, reset transistors, source follower transistors, transfer transistors, select transistors, complimentary metal-oxide-semiconductor (CMOS) image sensors, charged coupling device (CCD) sensors, active pixel sensors, passive pixel sensors, other sensors diffused or otherwise formed in the semiconductor substrate 10, other active and/or passive features configured and coupled to provide proper functions such as imaging and/or sensing, and/or combinations thereof. As such, the sensor elements 20 may comprise conventional and/or future-developed image sensing devices. The sensor elements may comprise a plurality of pixels disposed in a sensor array or other proper configuration. The plurality of sensor pixels may be designed having various sensor types. For example, one group of sensor pixels may be CMOS image sensors and another group of sensor pixels may be passive sensors. Moreover, the sensor elements may comprise color image sensors and/or monochromatic image sensors. Additional circuitry and input/outputs are typically provided adjacent to the sensor elements for providing an operation environment for the sensor elements and for supporting external communications with the sensor elements. For example, the sensor elements may further comprise or be coupled to components such as an electric circuit so that the sensor elements are operable to provide a proper response to illuminated light. In some embodiments, each of the sensor elements may be configured to correspond with specific light wavelengths, such as a sensor element for sensing a red light wavelength, a sensor element for sensing a green light wavelength, and a sensor element for sensing a blue light wavelength.

As depicted in FIG. 1, the sensor element 20 in each pixel region includes a transistor structure 14 and a light-sensing region 16 formed in and/or on the substrate 10. The transistor structure 14 comprises a gate electrode 18 formed over a gate dielectric layer 22. A spacer 24 is formed along the sidewalls of the gate electrode 18. Source/drain regions 26 are formed on the semiconductor substrate 10 laterally adjacent the gate electrode 18. In an embodiment, the spacer 24 is formed of silicon oxide, silicon nitride or the combinations thereof. The gate dielectric layer 22 may be formed of silicon oxide, silicon nitride or a high-k dielectric material, and the gate electrode 18 may be formed of doped polysilicon, metal or any other conductive materials. Other materials, however, may be used.

The light-sensing region 16 is formed on and coupled to the source region 26 of the transistor structure 14. The light-sensing region 16 may be formed by implanting impurities via an ion implant process into the substrate 10 to form, for example, a PN junction photo-diode, a PNP photo-transistor, an NPN photo-transistor, or the like. In an embodiment, an n-type impurity is implanted into the active region adjacent one side of the gate electrode 18 to form an n-photodiode region, and a p-type impurity is implanted to a surface of the n-photodiode region to form a p-photodiode region, thereby completing the light-sensing region 16. Here, impurity implantation to form the n-photodiode region and the p-photodiode region may be performed by tilt ion implantation, for example.

Multi-layer interconnection structure 30 including the metal interconnects, metal contacts and other circuitry are provided inside a plurality of inter-layer dielectric layers 28 formed on the sensor element 20 on the semiconductor substrate 10. The inter-layer dielectric layers 28 are formed on the semiconductor substrate 10 to isolate the interconnection structure 30. Various etch stop/barrier layers may be interposed between adjacent inter-layer dielectric layers 28 for providing an etch stop function utilized during damascene processes or a barrier function to eliminate moisture diffusion to the interconnection structure 30 and copper migration to the inter-layer dielectric layers 28. The stop/barrier layers may include silicon nitride, silicon oxynitride, or other suitable materials.

The inter-layer dielectric layers 28 may include silicon dioxide such as undoped silica glass (USG), silicon nitride, silicon oxynitride, polyimide, spin-on glass (SOG), fluoride-doped silicate glass (FSG), carbon doped silicon oxide such as SiCOH, BLACK DIAMOND® (Applied Materials of Santa Clara, Calif.), XEROGEL®, AEROGEL®, amorphous fluorinated carbon, Parylene, BCB (bis-benzocyclobutenes), SILK® (Dow Chemical, Midland, Mich.), and/or other suitable materials. The inter-layer dielectric layers 28 may be formed by any technique including spin-on, CVD, sputtering, or other suitable processes. For example, plasma enhanced (PE) CVD may be utilized to form silicon oxide from silane ($SiH_4$) or tetraethoxysilane (TEOS). In another example, high-density plasma (HDP) CVD may be utilized.

The interconnection structure 30 and the inter-layer dielectric layers 28 may be formed in an integrated process referred to as a damascene process, such as a dual damascene process or a single damascene process. The interconnection structure 30 is coupled to the sensor element 20 and other electric units formed on the semiconductor substrate 10. The interconnection structure 30 includes various metal features, and contact features configured between metal layers and the semiconductor substrate 10. The interconnection structure 30 further includes vias each configured between adjacent metal layers, coupling adjacent metal layers to one another. In the exemplary embodiment of this disclosure, the interconnection structure 30 includes copper. The interconnection structure 30 may alternatively or collectively include other conductive materials such as copper alloy, titanium, titanium nitride, tantalum, tantalum nitride, tungsten, polysilicon, metal silicide, or combinations thereof. The metal silicide may include nickel silicide, cobalt silicide, tungsten silicide, tantalum silicide, titanium silicide, platinum silicide, erbium silicide, palladium silicide, or combinations thereof. The interconnection structure 30 may include multiple-layer structures, such as a barrier layer, a copper seed layer, and bulk copper. In one example, the top metal layer includes aluminum and the rest of the metal layers include copper. The interconnection structure 30 may be formed by a technique such as chemical vapor deposition, physical vapor deposition (PVD or sputtering), plating, other suitable processes, or combinations thereof. For example, PVD may be used to form a copper seed layer, and then a plating process may be employed to deposit bulk copper for interconnection. The metal layers in FIG. 1 are only for example and simplicity. In various embodiments, the interconnection structure 30 may include less or more than three metal layers.

Metal layers provided inside the Multi-layer interconnection structure 30 including the metal interconnects, metal contacts and other circuitry are provided inside a plurality of inter-layer dielectric layers 28 form one or more capacitors 32 in the pixel region P over the frontside 10a of the semiconductor substrate 10. MIM capacitor is one device structure employed to increase capacitance. In its simplest configuration, a number of horizontal parallel plates of metal are stacked into several layers, separated by dielectrics. The plates are conductive and alternately coupled to form opposite electrodes of a capacitor. The vertical stack of plates is simple to construct, and offers more capacitance per unit area than two conductive surfaces alone. FIG. 1 is a cross section view depicting a portion of a pixel region P utilizing metal-insulator-metal (MIM) capacitors. In one embodiment utilizing a MIM capacitor as a stacked capacitor, the MIM capacitor 32 is formed on one layer of the inter-layer dielectric layers 28, for example a first inter-layer dielectric layer 28a. The MIM capacitor 32 includes a bottom electrode 32b, a capacitor dielectric layer 28c formed over the bottom electrode 32b, and a top electrode 32t formed over the capacitor dielectric layer 28c. The top and bottom electrodes may be formed of a conductive material such as TiN, TaN, ruthenium, aluminum, tungsten, copper, or the like, and may be formed by means of a PVD, an ECP, or a CVD method. For example, Al, a Ti/TiN/Al/Ti/TiN layer structure, a Ti/Al/Ti/TiN layer structure, a Ti/Al/TiN layer structure, a Ti/TiN/Al/Ti layer structure, a Ti/TiN/Al/TiN layer structure, Cu, or a TaN/Cu/TaN layer structure may be used to form the top and bottom electrodes. The capacitor dielectric layer 28c is formed of at least one layer of the inter-layer dielectric layers 28, for example a second inter-layer dielectric layer 28b formed over the first inter-layer dielectric layer 28a. The capacitor dielectric layer 28c may be made of an oxide-containing film, a nitride film, a BPSG film, a TEOS layer using various sources for example, an electric furnace, a CVD method, or a PVD method. The capacitor dielectric layer 28c may be made of a high-dielectric constant dielectric film. Vias 34 may be formed through one or more of the inter-layer dielectric layers 28 to provide electrical connectivity to the underlying circuitry. In one embodiment, the vias 34 may be formed on the bottom electrode 32b and/or the top electrode 32t to provide electrical connectivity to the drain region 26 of the transistor structure 14.

The MIM capacitor 32 is formed in the BEOL metal rout over the frontside 10a in the pixel region P of the backside illuminated (BSI) image sensor to increase capacitance per unit area. For example, the capacitor can contribute to the capacitance increase in FD capacitor when FWC (Full Well Capacity) increases. The capacitor can meet other circuit design needs, such as A/D convert, and the like. Compared with the frontside illuminated (FSI) image sensor having capacitors in the pixel region and the peripheral region, the MIM capacitor 32 formed over the frontside 10a in the pixel region P of the backside illuminated (BSI) image sensor has the following advantages. First, there is no need for a large open area in the BEOL metal rout in the pixel region P since the light L projected towards the backside 10b of the backside illuminated (BSI) image sensor will not be blocked. The design of forming capacitors 32 over the frontside 10a in the pixel region P of the backside illuminated image sensor will neither degrade the pixel function nor increase the single chip size. Thereby, there is no need for adding capacitors in the peripheral region of the substrate. Moreover, it is easy to develop the capacitor process in the backside illuminated image sensor processes, and thus it is easy to extend to the next generation technology node.

It is understood that additional features may be formed over the interconnection structure 30 and the backside 10b of the semiconductor substrate 10. A wafer thinning process may be formed on the backside 10b of the substrate 10 to make the substrate 10 thin enough so that light L projected towards the backside 10b of the substrate 10 can reach the pixels. For example, a passivation structure, bon pads and external connections are formed over the interconnection structure 30. On the backside 10b of the substrate 10, a color filter layer and a plurality of lenses are provided. The color filters that support several different color filters (e.g., red, green, and blue) may correspond to the various sensor elements 20 on the substrate 10. The lenses, such as microlenses, in various positional arrangements with sensor elements 20 and/or color filters, such that incident light may be focused on the light-sensing regions 16. Other proper imaging features may further be formed on the backside of the substrate.

Figure 2:
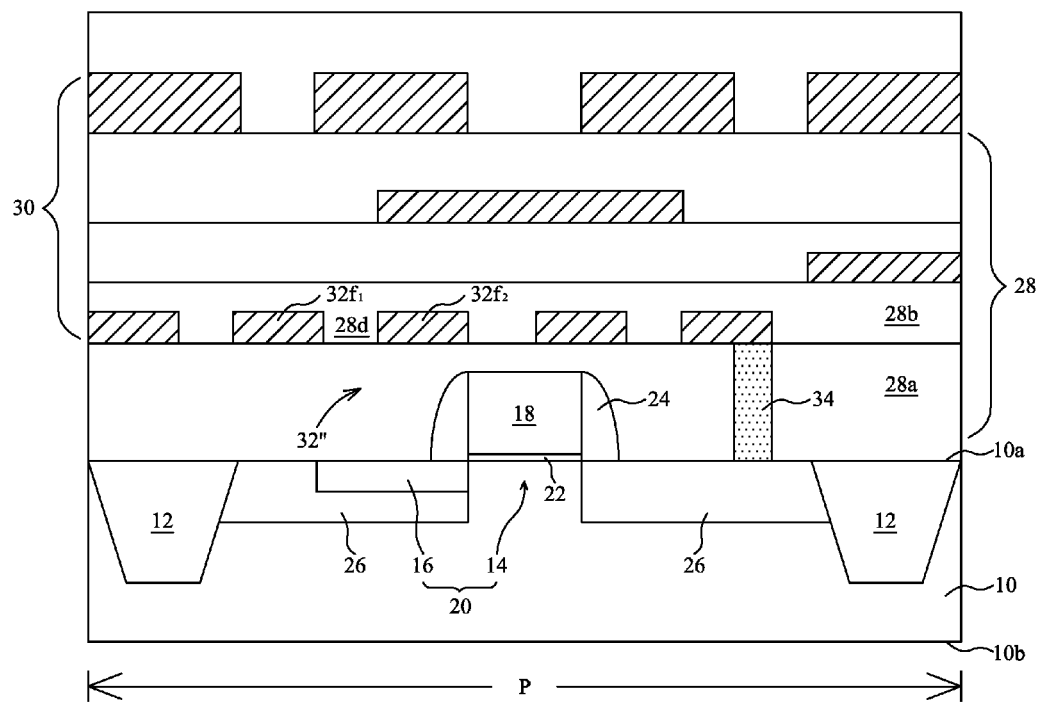
FIG. 2 is a cross-sectional diagram depicting an exemplary embodiment of a backside illuminate image sensor with a MOM capacitor.

FIG. 2 is a cross section view depicting an exemplary embodiment of a backside illuminated image sensor including a MOM capacitor in a pixel region. Explanation of the same or similar portions to the description in FIG. 1 will be omitted. Compared with the MIM capacitor formed in the backside illuminated (BSI) image sensor, the MOM capacitor 32" includes capacitor plates including capacitor fingers $32f_1$ and $32f_2$ placed in an alternating pattern with very small spaces between neighboring fingers. Regions 28d separated the neighboring fingers $32f_1$ and $32f_2$. The region 28d is formed of at least one layer of the inter-layer dielectric layers 28, for example a second inter-layer dielectric layer 28b formed over the first inter-layer dielectric layer 28a. The region 28d may be an oxide-containing dielectric region or an air gap region. This MOM capacitor 32" requires a complex design, but the form is efficient and the process steps required are usually already involved in the standard semiconductor device fabrication process. The MOM capacitor 32" may be expanded through multiple metallization layers, although it also may be formed in only one of the metallization layers. Accordingly, the capacitor plates may be repeated in multiple metallization layers, and the capacitor plates in different metallization layers are interconnected. The MOM capacitor 32" shown in FIG. 2 is only an example, and there are various different forms of MOM capacitors, which are applicable to the pixel region of the backside illuminated (BSI) image sensor.

The MOM capacitor 32" is formed in the BEOL metal rout over the frontside 10a in the pixel region P of the backside illuminated (BSI) image sensor to increase capacitance per unit area. For example, the capacitor can contribute to the capacitance increase in FD capacitor when FWC (Full Well Capacity) increases. The capacitor can meet other circuit design needs, such as A/D convert, and the like. Compared with the frontside illuminated (FSI) image sensor having capacitors in the pixel region and the peripheral region, the MOM capacitor 32" formed over the frontside 10a in the pixel region P of the backside illuminated (BSI) image sensor has the following advantages. First, there is no need for a large open area in the BEOL metal rout in the pixel region P since the light L projected towards the backside 10b of the backside illuminated (BSI) image sensor will not be blocked. The design of forming MOM capacitors 32" over the frontside 10a in the pixel region P of the backside illuminated image sensor will neither degrade the pixel function nor increase the single chip size. Thereby, there is no need of adding capacitors in the peripheral region of the substrate. Moreover, it is easy to develop the capacitor process in the backside illuminated image sensor processes, and thus it is easy to extend to the next generation technology node.

One aspect of this description relates to a method of forming a backside illuminated image sensor. The method comprises forming a sensor element overlying a semiconductor substrate, the semiconductor substrate having a front side and a backside. The sensor element is formed to overlie the front side of the semiconductor substrate. The sensor element is at least partially formed by forming a transistor structure including a gate, a spacer, a source and a drain; and forming a light sensing region disposed in the source, the light sensing region having a dopant type opposite a dopant type of the source, the light sensing region being formed to extend beneath the spacer of the transistor structure.

The method also comprises forming a capacitor overlying the sensor element, the capacitor being formed to overlie an entirety of the light sensing region in one direction and be electrically connected to the drain. The method further comprises forming a plurality of dielectric layers overlying the sensor element. The method additionally comprises forming an interconnection structure in the plurality of dielectric layers. At least two metal layers of the interconnection structure and at least one of the plurality of dielectric layers between the at least two metal layers form the capacitor and an additional metal layer of the interconnection structure is electrically connected between the sensor element and the capacitor.

Another aspect of this description relates to a method of forming a backside illuminated image sensor. The method comprises defining a pixel region on a semiconductor substrate having a front side and a backside, the pixel region being defined on the front side. The method also comprises forming a transistor structure in the pixel region overlying the front side of the semiconductor substrate, transistor structure including a gate electrode formed on the front side of the semiconductor substrate, a spacer, and source/drain regions formed in the front side of the semiconductor substrate laterally adjacent the gate electrode. The method also comprises forming a light-sensing element formed on the source region, the light-sensing element having a dopant type opposite a dopant type of the source region in which the light-sensing element is formed, the light-sensing element being formed to extend beneath the spacer of the transistor structure.

The method additionally comprises forming a capacitor overlying the light-sensing element, the capacitor being formed to overly an entirety of the light-sensing element in one direction and be electrically coupled to the transistor structure in the drain region. The method also comprises forming a plurality of dielectric layers overlying the transistor structure and the light-sensing element. The method further comprises forming an interconnection structure in the plurality of dielectric layers. At least two metal layers of the interconnection structure and at least one of the plurality of dielectric layers formed between the at least two metal layers form the capacitor and an additional metal layer of the interconnection structure is electrically connected between the sensor element and the capacitor.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. A method of forming a backside illuminated image sensor, the method comprising:
    forming a sensor element overlying a semiconductor substrate, the semiconductor substrate having a front side and a backside, the sensor element being formed to overlie the front side of the semiconductor substrate, the sensor element being at least partially formed by:
        forming a transistor structure including a gate, a spacer, a source and a drain; and
        forming a light sensing region disposed in the source, the light sensing region having a dopant type opposite a dopant type of the source, the light sensing region being formed to extend beneath the spacer of the transistor structure;
    forming a capacitor overlying the sensor element, the capacitor being formed to overlie an entirety of the light sensing region in one direction and be electrically connected to the drain;
    forming a plurality of dielectric layers overlying the sensor element; and
    forming an interconnection structure in the plurality of dielectric layers,
    wherein at least two metal layers of the interconnection structure and at least one of the plurality of dielectric layers between the at least two metal layers form the capacitor and an additional metal layer of the interconnection structure is electrically connected between the sensor element and the capacitor.

2. The method of claim 1, wherein the capacitor comprises a metal-insulator-metal (MIM) capacitor.

3. The method of claim 1, wherein the capacitor comprises a metal-oxide-metal (MOM) capacitor.

4. The method of claim 1, further comprising:
    defining a pixel region on the semiconductor substrate; and
    forming the sensor element in the pixel region.

5. The method of claim 4, further comprising:
    forming the capacitor in the pixel region.

6. The method of claim 4, further comprising:
    forming a light-sensing region of the sensor element in the pixel region on the front side of the semiconductor substrate.

7. The method of claim 4,
    wherein the transistor structure of the sensor element is formed on the front side of the semiconductor substrate.

8. The method of claim 1, further comprising:
    electrically coupling the capacitor to the sensor element.

9. The method of claim 1, wherein at least one metal layer of the interconnection structure comprises copper.

10. The method of claim 1, further comprising:
    attaching at least one color filter to the backside of the substrate.

11. The method of claim 1, further comprising:
    disposing at least one lens on the backside of the substrate.

12. The method of claim 1, further comprising:
    forming a plurality of sensor elements, each sensor element configured to correspond to a red light wavelength, a blue light wavelength or a green light wavelength.

13. A method of forming a backside illuminated image sensor, the method comprising:
- defining a pixel region on a semiconductor substrate having a front side and a backside, the pixel region being defined on the front side;
- forming a transistor structure in the pixel region overlying the front side of the semiconductor substrate, transistor structure including a gate electrode formed on the front side of the semiconductor substrate, a spacer, and source/drain regions formed in the front side of the semiconductor substrate laterally adjacent the gate electrode;
- forming a light-sensing element formed on the source region, the light-sensing element having a dopant type opposite a dopant type of the source region in which the light-sensing element is formed, the light-sensing element being formed to extend beneath the spacer of the transistor structure;
- forming a capacitor overlying the light-sensing element, the capacitor being formed to overly an entirety of the light-sensing element in one direction and be electrically coupled to the transistor structure in the drain region;
- forming a plurality of dielectric layers overlying the transistor structure and the light-sensing element; and
- forming an interconnection structure in the plurality of dielectric layers,
- wherein at least two metal layers of the interconnection structure and at least one of the plurality of dielectric layers formed between the at least two metal layers form the capacitor and an additional metal layer of the interconnection structure is electrically connected between the sensor element and the capacitor.

14. The method of claim 13, wherein the capacitor comprises a metal-insulator-metal (MIM) capacitor.

15. The method of claim 13, wherein the capacitor comprises a metal-oxide-metal (MOM) capacitor.

16. The method of claim 13, further comprising:
forming the capacitor in the pixel region.

17. The method of claim 13, wherein the capacitor comprises a bottom electrode, a top electrode and a capacitor dielectric layer formed between the bottom electrode and the top electrode, and at least one of the bottom electrode and the top electrode comprises copper.

18. The method of claim 13, wherein the light-sensing region is a photodiode region.

19. The method of claim 13, further comprising:
attaching at least one color filter to the backside of the substrate.

20. The method of claim 13, further comprising:
disposing at least one lens on the backside of the substrate.

* * * * *